US006683830B2

United States Patent
Eom

(10) Patent No.: US 6,683,830 B2
(45) Date of Patent: Jan. 27, 2004

(54) APPARATUS AND METHOD FOR DETECTING WOBBLE DEFECT

(75) Inventor: Woo-Sik Eom, Gyeonggi-do (KR)

(73) Assignee: Samsung Electronics Co., LTD, Suwon (KR)

(*) Notice: Subject to any disclaimer, the term of this patent is extended or adjusted under 35 U.S.C. 154(b) by 156 days.

(21) Appl. No.: 09/942,049

(22) Filed: Aug. 30, 2001

(65) Prior Publication Data
US 2002/0084859 A1 Jul. 4, 2002

(30) Foreign Application Priority Data
Jan. 4, 2001 (KR) .......................................... 2001-368

(51) Int. Cl.$^7$ ................................................ G11B 7/00
(52) U.S. Cl. ............................... 369/44.13; 369/44.12; 369/47.22; 369/50; 369/54; 369/53.35; 369/49; 331/DIG. 2; 331/1 A; 331/16; 331/34
(58) Field of Search ......................... 369/47.22, 53.35, 369/59.25, 47.28, 47.21, 44.26, 47.49, 44.12, 44.13, 47, 50, 54, 58, 59; 331/DIG. 2

(56) References Cited

U.S. PATENT DOCUMENTS 6,028,828 A * 2/2000 Maeda ....................... 369/47.4
6,088,307 A * 7/2000 Fushimi et al. ........... 369/44.13
6,144,627 A * 11/2000 Muto ....................... 369/30.21
6,442,116 B2 * 8/2002 Asano ....................... 369/47.28

FOREIGN PATENT DOCUMENTS

KR    1998-080166    11/1998
KR    2000-0006387   1/2000

* cited by examiner

Primary Examiner—Michael Tokar
Assistant Examiner—Linh V Nguyen
(74) Attorney, Agent, or Firm—Staas & Halsey LLP

(57) ABSTRACT

An apparatus and method are provided receiving wobble signals indicative of a wobble pattern formed on an optical medium. A wobble lock/unlock detector detects whether the wobble signals exist during a wobble window period and generates wobble lock/unlock signals indicative thereof. A wobble defect detector counts the wobble window signals in response to the wobble lock/unlock signals indicating that the wobble signals do not exist during the wobble window period, detects a wobble defect in response to the counted wobble window signals satisfying a defect decision condition, and outputs a defect detection signal indicative thereof.

38 Claims, 5 Drawing Sheets

APPARATUS AND METHOD FOR DETECTING WOBBLE DEFECT

CROSS-REFERENCE TO RELATED APPLICATIONS

This application claims the benefit of Korean Application No. 2001-368, filed Jan. 4, 2001, in the Korean Industrial Property Office, the disclosure of which is incorporated herein by reference.

BACKGROUND OF THE INVENTION

1. Field of the Invention

The present invention relates to an optical recording medium, and more particularly, to an apparatus and method for detecting wobble defects using a wobble signal detected from the optical recording medium having a wobble pattern.

2. Description of the Related Art

Several types of optical disks such as a Digital Versatile Disk-Random Access Memory (DVD-RAM), a DVD-Recordable (DVD-R), a DVD-Rewritable (DVDRW), and a DVD+RW, have been developed to date. A wobble pattern is present at a boundary region of a land and a groove in an optical recording medium. Thus, if numerous errors occur in the wobble pattern, there is a high probability that errors occur in data regions on lands and grooves.

Furthermore, a wobble signal corresponding to the wobble pattern may be used to detect recording position information on an optical disk. Also, the wobble signal may be used as a reference clock for detecting a record/playback position or as a reference signal for generating the reference clock. Thus, it is important to detect the presence of the wobble signal corresponding to a wobble pattern on the optical recording medium for the use of the optical recording medium.

SUMMARY OF THE INVENTION

Various objects and advantages of the invention will be set forth in part in the description that follows and, in part, will be obvious from the description, or may be learned by practice of the invention.

To solve the above problems, it is an object of the present invention to provide an apparatus and method for detecting a defect in a wobble pattern in an the optical recording medium using a wobble signal detected in an optical recording medium, in which verification is performed on a defective region if a defect exists in the wobble pattern when recording data in the optical recording medium.

Accordingly, to achieve the above and other objects, the present invention provides an apparatus for detecting a defect in a wobble pattern on an optical medium, the apparatus including: a phase-locked loop (PLL) generating phase-locked looped wobble signals and wobble clock signals in response to wobble signals from the wobble pattern; a window signal generator generating wobble window signals indicative of a wobble window period which comprises a window width condition based on the phase-locked looped wobble signals; a wobble lock/unlock detector detecting whether the wobble signals exist during the wobble window period and generating wobble lock/unlock signals setting one of a wobble unlock state when the wobble signals do not exist and satisfy a preset wobble unlock condition and a wobble lock state when the wobble signals do exist and satisfy a preset wobble lock condition; and a wobble defect detector counting the wobble window signals in response to the wobble lock/unlock signals indicating that the wobble signals do not exist during the wobble window period, detecting a wobble defect in response to the counted wobble window signals satisfying a defect decision condition, and outputting a defect detection signal indicative thereof.

The window width condition comprises the wobble window period during which a number of wobble clock signals are generated from an edge of the phase-locked looped wobble signals corresponding to a state in which the wobble signals are active. The wobble lock condition corresponds to a number at which the wobble signals are successively detected during the wobble window period. The wobble unlock condition corresponds to a number at which the wobble signals are not successively detected during the wobble window period. The predetermined defect decision condition corresponds to a number at which the wobble signals are not successively detected during a wobble window period in the wobble unlocked state.

The present invention also provides an apparatus receiving wobble signals indicative of a wobble pattern formed on an optical medium, the apparatus including: a wobble lock/unlock detector detecting whether the wobble signals exist during a wobble window period and generating wobble lock/unlock signals indicative thereof; and a wobble defect detector counting the wobble window signals in response to the wobble lock/unlock signals indicating that the wobble signals do not exist during the wobble window period, detecting a wobble defect in response to the counted wobble window signals satisfying a defect decision condition, and outputting a defect detection signal indicative thereof.

The present invention also provides a method of detecting a defect in a wobble pattern on an optical medium, the method including: generating phase-locked looped wobble signals and wobble clock signals in response to wobble signals from the wobble pattern; generating wobble window signals indicative of a wobble window period which comprises a window width condition based on the phase-locked looped wobble signals; detecting whether the wobble signals exist during the wobble window period; generating wobble lock/unlock signals setting one of a wobble unlock state when the wobble signals do not exist and satisfy a preset wobble unlock condition and a wobble lock state when the wobble signals do exist and satisfy a preset wobble lock condition; counting the wobble window signals in response to the wobble lock/unlock signals indicating that the wobble signals do not exist during the wobble window period; detecting a wobble defect in response to the counted wobble window signals satisfying a defect decision condition; and outputting a defect detection signal indicative thereof.

The present invention also provides for a method of receiving wobble signals indicative of a wobble pattern formed on an optical medium including: detecting whether the wobble signals exist during a wobble window period and generating wobble lock/unlock signals indicative thereof; counting the wobble window signals in response to the wobble lock/unlock signals indicating that the wobble signals do not exist during the wobble window period; detecting a wobble defect in response to the counted wobble window signals satisfying a defect decision condition; and outputting a defect detection signal indicative thereof.

The present invention also provides for an apparatus which receives a wobble signal indicative of a wobble pattern formed on an optical medium, including: a defect detector detecting whether a defect exists in the wobble pattern based upon the wobble signal; and a verifier which verifies data of a defective region of the optical medium corresponding to the wobble pattern in response to the defect existing.

These together with other objects and advantages, which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
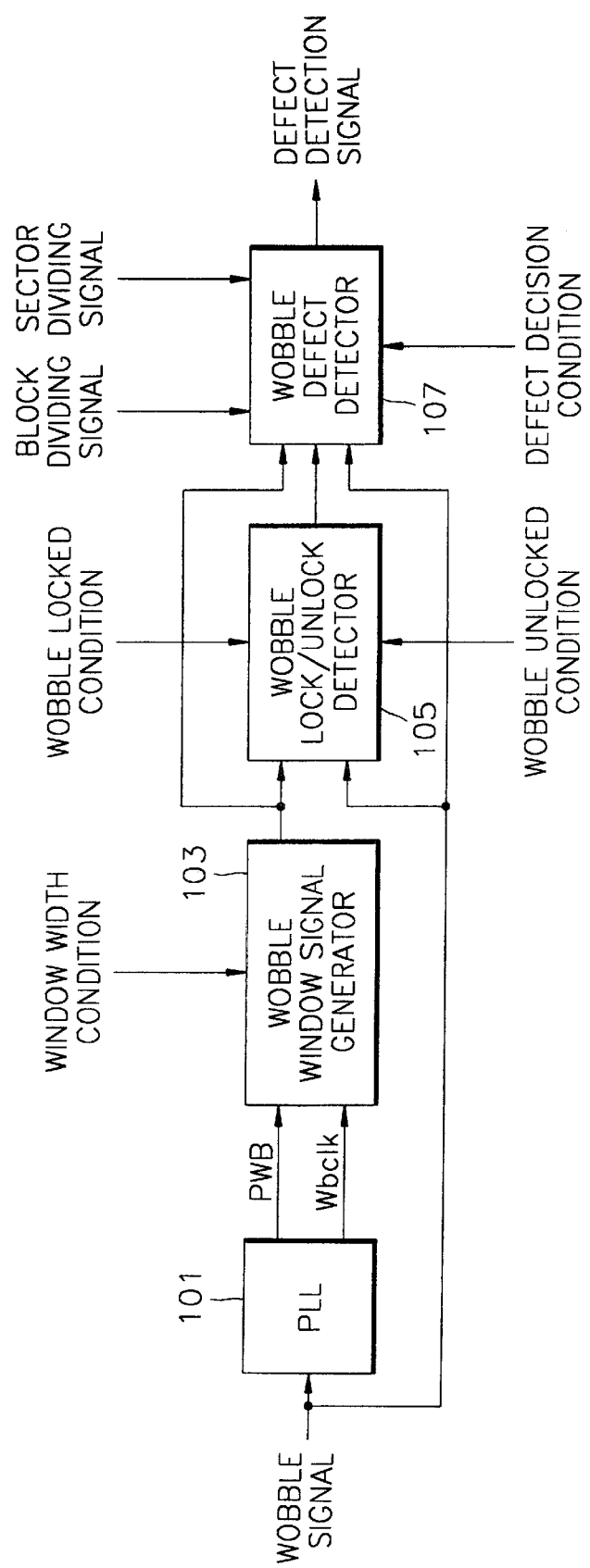
FIG. 1 is a function block diagram of a wobble defect detecting apparatus, in accordance with an exemplary embodiment of the present invention.
Figure 2:
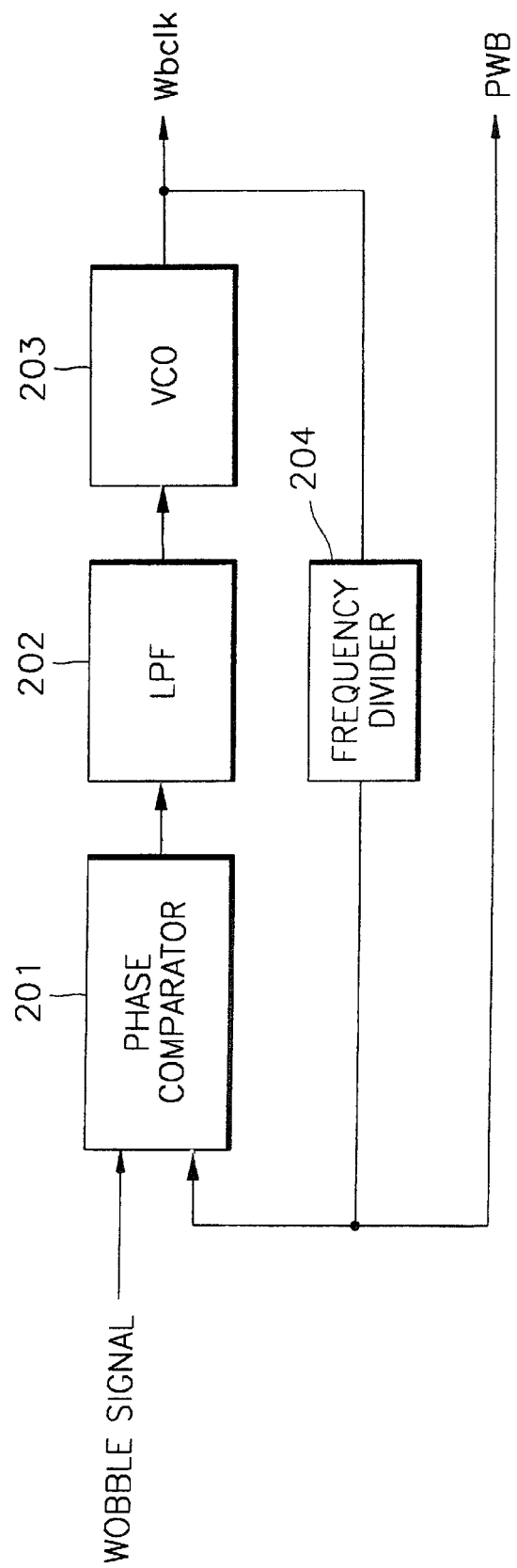
FIG. 2 is a detailed block diagram of a phase-locked loop (PLL) of FIG. 1.

Referring to FIG. 1, an apparatus for detecting a wobble defect according to the present invention includes a phase-locked loop (PLL) 101, a wobble window signal generator 103, a wobble lock/unlock detector 105, and a wobble defect detector 107. When a wobble signal is applied from an optical recording medium (not shown) through a radio frequency amplifier (RF-AMP) (not shown), the PLL 101 outputs a wobble clock signal Wbclk corresponding to a playback clock signal or a channel clock signal and a phase-locked looped signal PWB using the applied wobble signal. As shown in FIG. 2, the PLL 101 includes a phase comparator 201, a low-pass filter LPF, a voltage controlled oscillator (VCO) 203, and a frequency divider 204.

Figure 3:
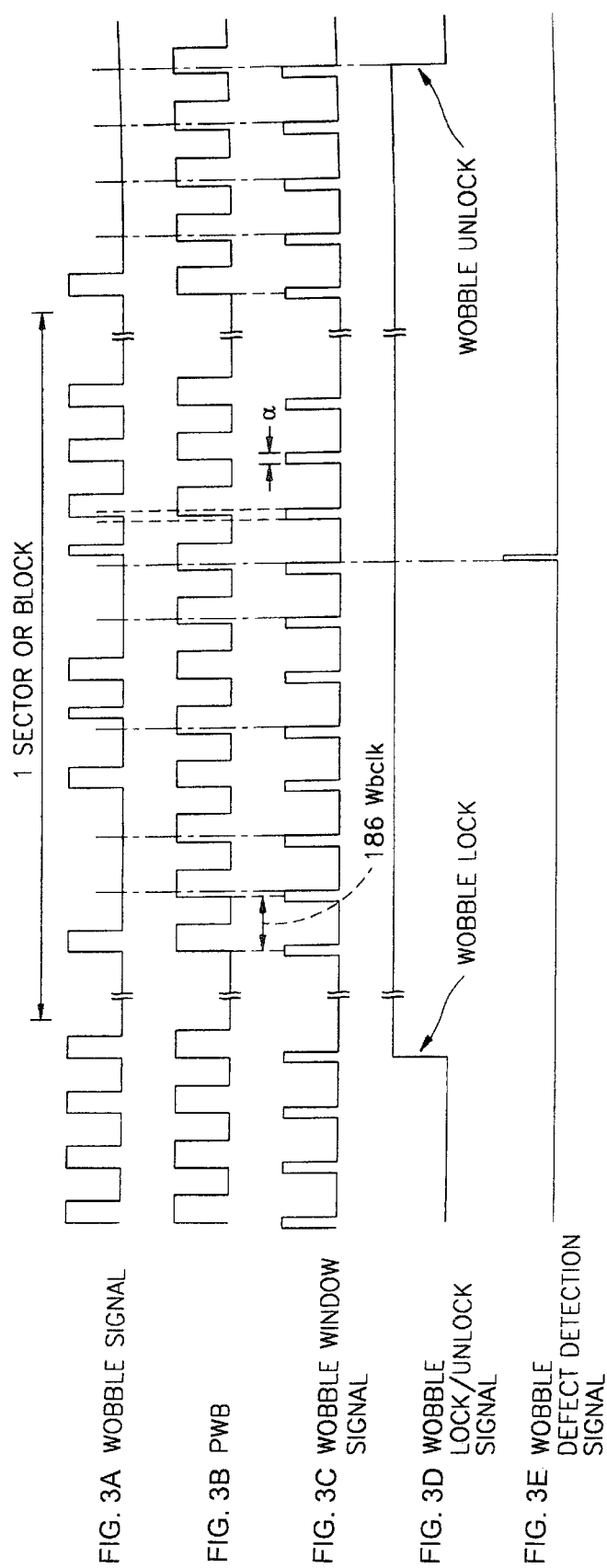
FIG. 3A is a timing diagram of a wobble signal is applied to the apparatus of FIG. 1.
FIG. 3B is a timing diagram of a phase-locked looped wobble signal PWB from a frequency divider of FIG. 1.
FIG. 3C is a timing diagram of a wobble window signal wobble from a window signal generator of FIG. 1.
FIG. 3D is a timing diagram of a wobble lock/unlock signal from a wobble lock/unlock signal generator of FIG. 1.
FIG. 3E is a timing diagram of a wobble defect detection signal from a wobble defect detector of FIG. 1.

That is, when the wobble signal is applied at a preset period as shown in FIG. 3A, the phase comparator 201 compares a phase of the applied wobble signal with a phase of a phase-locked looped wobble signal PWB generated by dividing the frequency of the wobble clock signal Wbclk by a predetermined factor, such as the wobble clock signal's Wbclk peak-to-peak value, in this instance by 186 and outputs a compared result. The LPF 202 filters out a high frequency component from the compared result of the phase comparator 201 and transmits a low frequency result to the VCO 203. The VCO 203 outputs a frequency corresponding to a voltage of the low frequency result from the LPF 202. That is, the VCO 203 outputs a frequency corresponding to a phase difference between the wobble signal and the phase-locked looped wobble signal, that is, the wobble clock signal Wbclk. The wobble clock signal Wbclk is transmitted to the wobble window signal generator 103 and the frequency divider 204. The frequency divider 204 outputs the phase-locked looped wobble signal PWB obtained by dividing the wobble clock signal Wbclk by 186, to the phase comparator 201 and the wobble window signal generator 103 of FIG. 1. In this case, the phase-locked looped wobble signal PWB from the frequency divider 204 has a period, as shown in FIG. 3B, with respect to the applied wobble signal.

Referring to FIG. 1, the wobble window signal generator 103 generates a wobble window signal having a window width condition based on the phase-locked looped wobble signal PWB from the PLL 101. The window width condition refers to the wobble window signal having a wobble window period during which the number of wobble clock signals Wbclk are generated from a rising edge of the phase-locked looped wobble signal corresponding to a state in which the wobble signal is active. For example, if the window width condition is set to 10 based on the rising edge of the phase-locked looped wobble signal PWB, as shown in FIG. 3C, a period during which 10 wobble clock signals Wbclk are generated from the rising edge of the phase-locked looped wobble signal PWB corresponding to the state in which the wobble window signal is active (i.e., "high" state as shown in FIG. 3C). The period is a width of the wobble window signal. In this case, the window width condition is provided from a system controller (not shown) or a microcomputer and set so that noise, such as jitter of the wobble signal, can be accounted for.

When the wobble window signal and the wobble signal are applied, the wobble lock/unlock detector 105 detects whether the wobble window signal is set to a lock or an unlock state depending on preset wobble lock and unlock conditions. That is, if the wobble lock/unlock detector 105 successively detects that the wobble signal exists during an interval the wobble window signal is at a predetermined state, e.g., high, and a number of detections that the wobble signal exists satisfies a preset wobble lock condition, a signal setting a wobble lock state is generated, as shown in FIG. 3D. On the other hand, if the wobble lock/unlock detector 105 successively detects that the wobble signal does not exist during a period the wobble window signal is high and a number of detections that the wobble signal does not exist satisfies a preset wobble unlock condition, a signal setting a wobble unlock state is generated, as shown in FIG. 3D.

Figure 4:
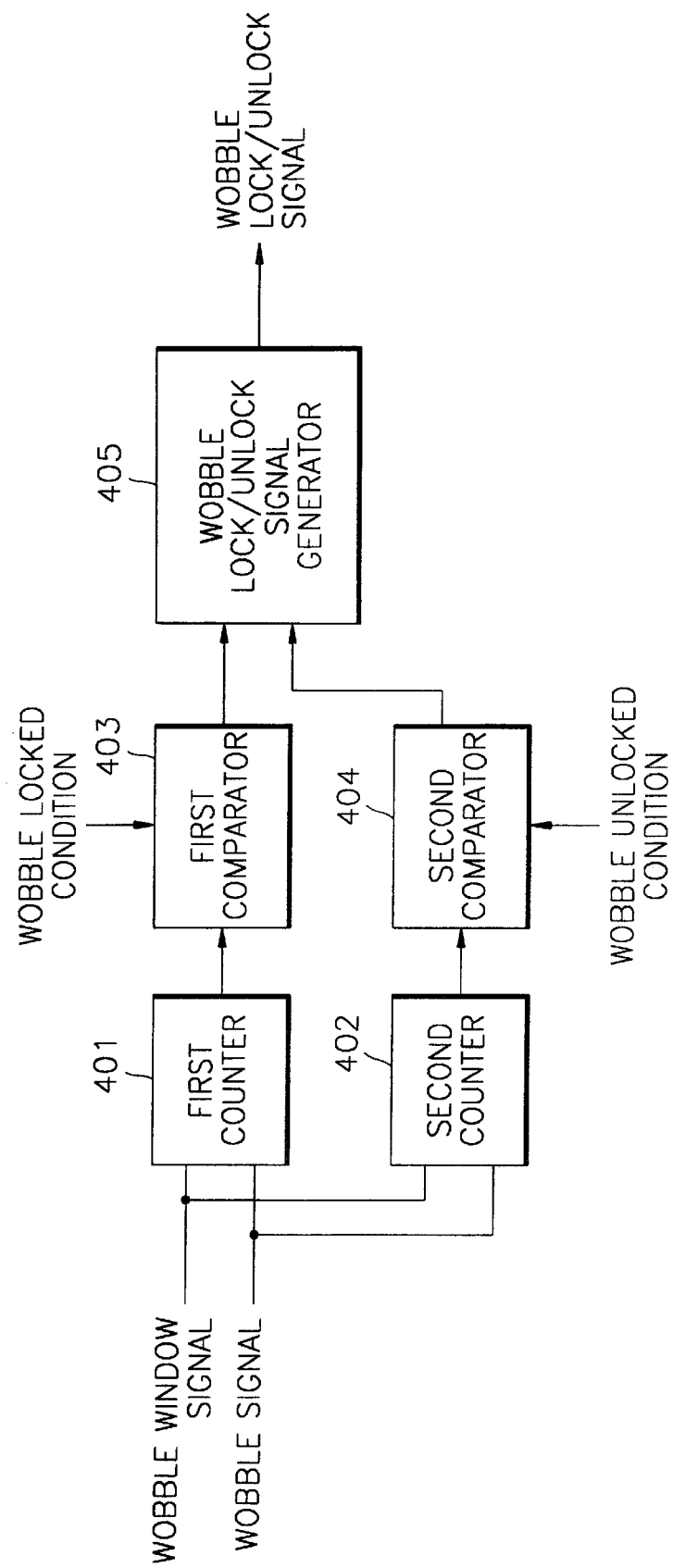
FIG. 4 shows an example of the wobble lock/unlock detector of FIG. 1.

FIG. 4, shows an example of the wobble lock/unlock detector 105, the wobble lock/unlock detector 105 including a first counter 401, a second counter 402, a first comparator 403, a second comparator 404, and a wobble lock/unlock signal generator 405. If the wobble signal exists when the wobble window signal is high, the first counter 401 counts (up or down) a number of wobble window signals. However, if the wobble signal does not exist when the wobble window signal is high, the first counter 401 is reset or cleared. A count value from the first counter 401 is output to the first comparator 403. The first comparator 403 compares the count value with a preset wobble locked condition. The wobble locked condition corresponds to a number at which the wobble signal is successively detected, which is provided by the system controller. For example, assuming that the wobble locked condition is set to '3' and the first counter 401 is an up counter, if the count value provided from the first counter 401 is 3, the first comparator 403 outputs a signal requesting generation of a signal indicative of a wobble locked state to the wobble lock/unlock signal generator 405.

If the wobble signal does not exist when the wobble window signal is high, the second counter 402 counts (up or down) a number of the wobble clock signals Wbclk.

Conversely, if the wobble signal exists when the wobble window signal is high, the second counter 402 is reset or cleared. The count value from the second counter 402 is output to the second comparator 404. The second comparator 404 compares the count value provided from the second counter 402 with a preset wobble unlocked condition. The preset wobble unlock condition refers to a number at which the wobble signal is not successively detected, which is provided by the system controller. For example, assuming that the wobble unlocked condition is set to '4' and the second counter 402 is an up counter, if the count value provided from the second counter 402 is '4', the second comparator 404 outputs a signal requesting generation of a signal indicative of a wobble unlocked state to the wobble lock/unlock signal generator 405. The wobble locked and unlocked conditions may be set to the same value. The wobble lock/unlock signal generator 405 generates a wobble lock/unlock signal, as shown in FIG. 3D, depending on the signals provided from the first and second comparators 403 and 404.

The wobble defect detector 107 detects a wobble defect if the wobble window signal, the wobble lock/unlock signal, and the wobble signal are applied and the number at which the wobble signal is not detected satisfies a defect decision condition during the period of the wobble window signal for each block or sector during a wobble lock period. Accordingly, the wobble defect detector 107 outputs a wobble defect detection signal, as shown in FIG. 3E. The defect decision condition corresponds to a number at which the wobble signal is not detected. For example, if the defect decision condition is set to '5' and the number at which the wobble signal is not detected during the wobble window period for each block or sector is 5, the wobble defect detector 107 outputs the defect detection signal indicating that a wobble defect occurs in each block or sector. The defect decision condition is provided from the system controller (not shown). A block dividing signal and a sector dividing signal are provided to the wobble defect detector 107 from a control block or signal, such as an encoder/decoder block or from a decoder or an encoder in an optical recording medium drive (or a driver). However, in the case of an optical recording medium in which sectors cannot be distinguished, the block dividing signal may be provided from a decoder and the sector dividing signal may be provided from a control signal from an encoder, such as a sector sync signal.

Figure 5:
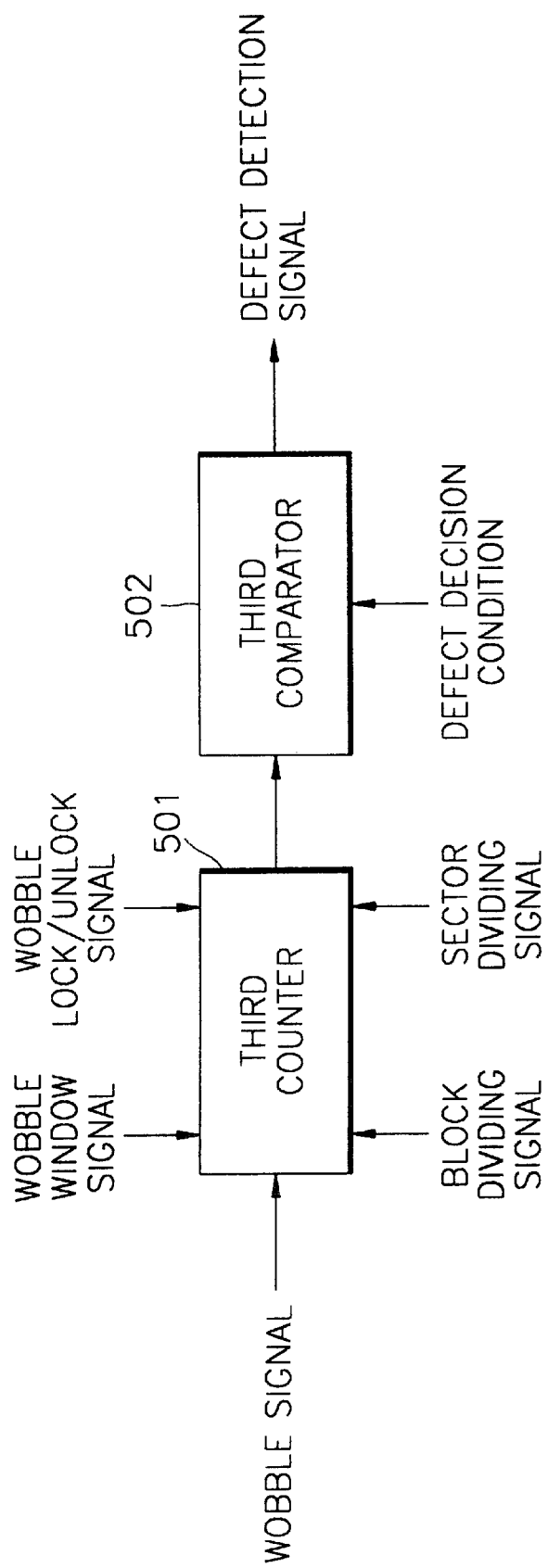
FIG. 5 shows an example of the wobble defect detector of FIG. 1.

FIG. 5 shows an example of the wobble defect detector 107 of FIG. 1. The wobble defect detector 107 includes a third counter 501 and a third comparator 502. The third counter 501 is reset or cleared by the block dividing signal and the sector dividing signal, and a period during which the number of wobble window signals is actually counted by the third counter 501 is set by the wobble lock/unlock signal. If the wobble signal does not exist during the wobble window period in a wobble locked state, the third counter 501 counts (up or down) the number of the wobble window signals. A count result from the third counter 501 is output to the third comparator 502. If the count result provided from the third counter 501 equals the defect decision condition, the third comparator 502 outputs the defect detection signal. For illustrative purposes, the third counter 501 is an up counter and the defect decision condition is set to '5'. If the count result provided from the third counter 501 is '5', the third comparator 502 outputs the defect detection signal.

The defect detection signal is provided to an element, such as a verifier or microprocessor in the system controller (not shown). When the defect detection signal is applied, the system controller recognizes the defect detection signal as an occurrence of a defect in a wobble pattern of a block or sector, and performs a verification process on data recorded on the block or sector. If the verification result is not satisfactory, the data may be rewritten in the block or sector or the data of the block or sector may be rewritten to a different region.

The logic state of each signal in this invention is not limited to the above particular embodiment. That is, the logic state of each signal may be set differently. For example, although an active state of the wobble window signal has been set at a "high level" in the present embodiment, the active state may be set at a "low level."

According to the present invention, an optical recording medium includes a predetermined wobble pattern. If a defect is present in the wobble pattern within a sector or block in the optical recording medium during a recording operation, a verification of an error is performed on data recorded on the sector or block in which a defect is present, thereby minimizing data loss when recording the data on a defect region including the sector or block.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. An apparatus for detecting a defect in a wobble pattern on an optical medium, the apparatus comprising:

a phase-locked loop (PLL) generating phase-locked looped wobble signals and wobble clock signals in response to wobble signals indicative of the wobble pattern;

a window signal generator generating wobble window signals indicative of a wobble window period which comprises a window width condition based on the phase-locked looped wobble signals;

a wobble lock/unlock detector detecting whether the wobble signals exist during the wobble window period and generating wobble lock/unlock signals setting one of a wobble unlock state when the wobble signals do not exist and satisfy a preset wobble unlock condition and a wobble lock state when the wobble signals do exist and satisfy a preset wobble lock condition; and a wobble defect detector counting the wobble window signals in response to the wobble lock/unlock signals indicating that the wobble signals do not exist during the wobble window period, detecting a wobble defect in response to the counted wobble window signals satisfying a defect decision condition, and outputting a defect detection signal indicative thereof.

2. The apparatus of claim 1, wherein the window width condition comprises the wobble window period during which a number of wobble clock signals are generated from an edge of the phase-locked looped wobble signals corresponding to a state in which the wobble signals are active.

3. The apparatus as recited in claim 1, wherein the predetermined defect decision condition corresponds to a number at which the wobble signals are not successively detected during the wobble window period in the wobble unlocked state.

4. The apparatus as recited in claim 1, wherein the wobble defect detector detects whether a defect exists during the wobble window period for each block or sector of data recorded on the optical medium.

5. The apparatus as recited in claim 1, wherein the wobble lock/unlock detector successively detects that the wobble signals exist during the wobble window period based on a number of detections that the wobble signals exist satisfies a preset wobble lock condition.

6. The apparatus as recited in claim 1, wherein the wobble lock/unlock detector successively detects that the wobble signals do not exist during the wobble window period based on a number of detections that the wobble signals do not exist satisfies a preset wobble unlock condition.

7. The apparatus as recited in claim 1, wherein the wobble lock/unlock detector comprises:

- a first counter counting a number of the wobble window signals when the wobble signals exist during the wobble window period and outputting a count result or being reset or cleared if the wobble signals do not exist during the wobble window period;
- a first comparator comparing the count result from the first counter with the wobble locked condition and outputting a signal requesting generation of a signal indicative of the wobble locked state when the count result satisfies the wobble locked condition;
- a second counter counting the number of the wobble window signals when the wobble signals do not exist during the wobble window period and outputting a count result or being reset or cleared if the wobble signals exist during the wobble window period; and
- a second comparator comparing the count result from the second is counter with the wobble unlocked condition and outputting a signal requesting generation of a signal indicative of the wobble unlocked state when the count result satisfies the wobble unlocked condition; and
- a wobble lock/unlock signal generator generating a signal indicative of the wobble locked state in response to the request signal from the first comparator or the wobble unlocked state in response to the request signal from the second comparator.

8. The apparatus as recited in claim 7, wherein the wobble lock condition corresponds to a number at which the wobble signals are successively detected during the wobble window period.

9. The apparatus as recited in claim 7, wherein the wobble unlock condition corresponds to a number at which the wobble signals are not successively detected during the wobble window period.

10. The apparatus as recited in claim 1, wherein the wobble defect detector comprises:

- a third counter counting a number of the wobble window signals if the wobble signals do not exist during the wobble window period in the wobble unlocked state and outputting a count result indicative thereof; and
- a third comparator comparing the count result from the third counter with the defect decision condition and outputting the defect detection signal if the count value satisfies the defect decision condition.

11. The apparatus as recited in claim 9, wherein the third counter is reset or cleared by a block dividing signal and a sector dividing signal from an encoder/decoder block or from a decoder or an encoder in an optical recording medium drive.

12. The apparatus as recited in claim 1, wherein the phase-locked loop (PLL) comprises:

- a phase comparator comparing a phase of the wobble signals with a phase of the phase-locked looped wobble signals and outputting a compared result,
- a filter filtering the compared result,
- an oscillator receiving the filtered compared result and generating the wobble clock signals according to a frequency corresponding to the compared result between the wobble signals and the phase-locked looped wobble signals, and
- a frequency divider dividing the wobble clock signals by a predetermined factor and outputting the phase-locked looped wobble signals to the wobble signal generator.

13. The apparatus as recited in claim 1, wherein a system controller receives the defect detection signal, recognizes the defect detection signal as an occurrence of a defect in a wobble pattern of a block or sector of the optical medium, performs a verification process on data recorded on the block or sector, if the verification result is not satisfactory, and rewrites the data in the block or sector or rewrites the data of the block or sector to a different region of the optical medium.

14. The apparatus as recited in claim 1, wherein the defect decision condition is provided from a system controller.

15. The apparatus as recited in claim 14, wherein in the optical medium in which sectors cannot be distinguished the block dividing signal is provided from a decoder and the sector dividing signal is provided from a control signal from an encoder.

16. An apparatus receiving wobble signals indicative of a wobble pattern formed on an optical medium, the apparatus comprising:

- a wobble lock/unlock detector detecting whether the wobble signals exist during a wobble window period and generating wobble lock/unlock signals indicative thereof; and
- a wobble defect detector counting the wobble window signals in response to the wobble lock/unlock signals indicating that the wobble signals do not exist during the wobble window period, detecting a wobble defect in response to the counted wobble window signals satisfying a defect decision condition, and outputting a defect detection signal indicative thereof.

17. The apparatus as recited in claim 16, wherein the predetermined defect decision condition corresponds to a number at which the wobble signals are not successively detected during the wobble window period in the wobble unlocked state.

18. The apparatus as recited in claim 16, wherein the wobble defect detector detects whether a defect exists during the wobble window period for each block or sector of data recorded on the optical medium.

19. The apparatus as recited in claim 16, wherein the wobble lock/unlock detector successively detects that the wobble signals exist during the wobble window period based on a number of detections that the wobble signals exist satisfies a preset wobble lock condition.

20. The apparatus as recited in claim 16, wherein the wobble lock/unlock detector successively detects that the wobble signals do not exist during the wobble window period based on a number of detections that the wobble signals do not exist satisfies a preset wobble unlock condition.

21. The apparatus as recited in claim 16, wherein the wobble lock/unlock detector comprises:

- a first counter counting a number of wobble window signals when the wobble signals exist during the wobble window period and outputting a count result or being reset or cleared if the wobble signals do not exist during the wobble window period;

a first comparator comparing the count result from the first counter with the wobble locked condition and outputting a signal requesting generation of a signal indicative of the wobble locked state when the count result satisfies the wobble locked condition;

a second counter counting the number of wobble window signals when the wobble signals do not exist during the wobble window period and outputting a count result or being reset or cleared if the wobble signals exist during the wobble window period; and a second comparator comparing the count result from the second is counter with the wobble unlocked condition and outputting a signal requesting generation of a signal indicative of the wobble unlocked state when the count result satisfies the wobble unlocked condition; and a wobble lock/unlock signal generator generating a signal indicative of the wobble locked state in response to the request signal from the first comparator or the wobble unlocked state in response to the request signal from the second comparator.

22. The apparatus as recited in claim 16, wherein the wobble defect detector comprises:

a third counter counting a number of the wobble window signals if the wobble signals do not exist during the wobble window period in the wobble unlocked state and outputting a count result indicative thereof; and a third comparator comparing the count result from the third counter with the defect decision condition and outputting the defect detection signal if the count value satisfies the defect decision condition.

23. An apparatus which receives a wobble signal indicative of a wobble pattern formed on an optical medium, comprising:

a defect detector detecting whether a defect exists in the wobble pattern based upon the wobble signal; and a verifier which verifies data of a defective region of the optical medium corresponding to the wobble pattern in response to the defect existing.

24. A method of detecting a defect in a wobble pattern on an optical medium, the method comprising:

generating phase-locked looped wobble signals and wobble clock signals in response to wobble signals from the wobble pattern;

generating wobble window signals indicative of a wobble window period which comprises a window width condition based on the phase-locked looped wobble signals;

detecting whether the wobble signals exist during the wobble window period;

generating wobble lock/unlock signals setting one of a wobble unlock state when the wobble signals do not exist and satisfy a preset wobble unlock condition and a wobble lock state when the wobble signals do exist and satisfy a preset wobble lock condition;

counting the wobble window signals in response to the wobble lock/unlock signals indicating that the wobble signals do not exist during the wobble window period;

detecting a wobble defect in response to the counted wobble window signals satisfying a defect decision condition; and outputting a defect detection signal indicative thereof.

25. The method as recited in claim 24, wherein the window width condition comprises the wobble window period during which a number of wobble clock signals are generated from an edge of the phase-locked looped wobble signals corresponding to a state in which the wobble signals are active.

26. The method as recited in claim 24, wherein the predetermined defect decision condition corresponds to a number at which the wobble signals are not successively detected during the wobble window period in the wobble unlocked state.

27. The method as recited in claim 24, further comprising:

detecting whether a defect exists during the wobble window period for each block or sector of data recorded on the optical medium.

28. The method as recited in claim 24, further comprising:

counting a number of the wobble window signals when the wobble signals exist during the wobble window period;

outputting a first count result or being reset or cleared if the wobble signals do not exist during the wobble window period;

comparing the first count result from the first counter with the wobble locked condition;

outputting a first signal requesting generation of a signal indicative of the wobble locked state when the first count result satisfies the wobble locked condition; and generating a signal indicative of the wobble locked state in response to the first request signal.

29. The method as recited in claim 28, further comprising:

counting a number of the wobble window signals when the wobble signals exist during the wobble window period;

outputting a second count result or being reset or cleared if the wobble signals do not exist during the wobble window period;

comparing the second count result from the second counter with the wobble locked condition;

outputting a second signal requesting generation of a signal indicative of the wobble unlocked state when the second count result satisfies the wobble unlocked condition; and generating a signal indicative of the wobble unlocked state in response to the second request signal.

30. The method as recited in claim 24, further comprising:

counting the number of the wobble window signals if the wobble signals do not exist during the wobble window period in the wobble unlocked state and outputting a third count result;

comparing the third count result with the defect decision condition; and outputting the defect detection signal if the third count value satisfies the defect decision condition.

31. The method as recited in claim 24, further comprising:

comparing a phase of the wobble signals with a phase of the phase-locked looped wobble signals and outputting a compared result;

filtering the compared result;

receiving the filtered compared result and generating the wobble clock signals according to a frequency corresponding to the compared result between the wobble signals and the phase-locked looped wobble signals; and dividing the wobble clock signals by a predetermined factor and outputting the phase-locked looped wobble signals indicative thereof.

32. The method as recited in claim 24, further comprising:

receiving the defect detection signal;

recognizing the defect detection signal as an occurrence of a defect in a wobble pattern of a block or sector of the optical medium; and performing a verification process on data recorded on the block or sector, if the verification result is not satisfactory, and rewriting the data in the block or sector or rewriting the data of the block or sector to a different region of the optical medium.

33. A method of receiving wobble signals indicative of a wobble pattern formed on an optical medium comprising:

detecting whether the wobble signals exist during a wobble window period and generating wobble lock/unlock signals indicative thereof;

counting the wobble window signals in response to the wobble lock/unlock signals indicating that the wobble signals do not exist during the wobble window period;

detecting a wobble defect in response to the counted wobble window signals satisfying a defect decision condition; and outputting a defect detection signal indicative thereof.

34. The method as recited in claim 33, wherein the predetermined defect decision condition corresponds to a number at which the wobble signals are not successively detected during a wobble window period in the wobble unlocked state.

35. The method as recited in claim 33, further comprising:

detecting whether a defect exists during a wobble window period for each block or sector of data recorded on the optical medium.

36. The method as recited in claim 33, further comprising:

counting a number of the wobble window signals when the wobble signals exist during the wobble window period;

outputting a first count result or being reset or cleared if the wobble signals do not exist during the wobble window period;

comparing the first count result from the first counter with the wobble locked condition;

outputting a first signal requesting generation of a signal indicative of the wobble locked state when the first count result satisfies the wobble locked condition; and generating a signal indicative of the wobble locked state in response to the first request signal.

37. The method as recited in claim 33, further comprising:

counting a number of the wobble window signals when the wobble signals exist during the wobble window period;

outputting a second count result or being reset or cleared if the wobble signals do not exist during the wobble window period;

comparing the second count result from the second counter with the wobble locked condition;

outputting a second signal requesting generation of a signal indicative of the wobble unlocked state when the second count result satisfies the wobble unlocked condition; and generating a signal indicative of the wobble unlocked state in response to the second request signal.

38. The method as recited in claim 33, further comprising:

counting the number of the wobble window signals if the wobble signals do not exist during the wobble window period in the wobble unlocked state and outputting a third count result;

comparing the third count result with the defect decision condition; and outputting the defect detection signal if the third count value satisfies the defect decision condition.

* * * * *